United States Patent [19]
Antao

[11] Patent Number: 6,012,626
[45] Date of Patent: Jan. 11, 2000

[54] METHOD OF FORMING BALL GRID ARRAY CONTACTS

[75] Inventor: Joseph S. Antao, Allen, Tex.

[73] Assignee: Texas Instruments Incorporated, Dallas, Tex.

[21] Appl. No.: 08/964,514

[22] Filed: Nov. 5, 1997

[51] Int. Cl.[7] ................................................... B23K 35/00
[52] U.S. Cl. .................... 228/254; 228/56.3; 228/246; 228/180.22
[58] Field of Search .................................. 228/254, 56.3, 228/246, 180.22

[56] References Cited

U.S. PATENT DOCUMENTS

| | | | |
|---|---|---|---|
| 5,029,748 | 7/1991 | Lauterbach et al. | 228/180.1 |
| 5,242,097 | 9/1993 | Socha | 228/56.3 |
| 5,620,129 | 4/1997 | Rogren | 228/56.3 |

*Primary Examiner*—Patrick Ryan
*Assistant Examiner*—M. Alexandra Elve
*Attorney, Agent, or Firm*—W. Daniel Swayze, Jr.; Wade James Brady, III; Richard L. Donaldson

[57] ABSTRACT

The invention is to a method for forming solder contact balls (12) for a ball grid array semiconductor device. A solder sheet (15) is formed having solder elements (18) extending out at least one side of the solder sheet (15). The solder sheet is placed over and aligned on a semiconductor package (50) on which solder balls (12) are to be electrically connected to contact areas (51). The solder sheet (15) is aligned with one solder element (18) over each contact area (51). The package (50) and solder sheet (15) is heated to cause the solder elements (18) on the solder sheet (15) to separate and reflow such that the surface tension of the reflowed solder of each solder element (18) forms a solder ball (12) over a contact area (51).

12 Claims, 5 Drawing Sheets

METHOD OF FORMING BALL GRID ARRAY CONTACTS

FIELD OF THE INVENTION

This invention relates to semiconductor devices, and more particularly to a method of forming Ball Grid Array contacts on semiconductor devices.

BACKGROUND OF THE INVENTION

The density of the integrate circuits has been increasing over the past years to meet the higher performance required of the integrated circuits. Package size is getting smaller and smaller to meet the same high performance requirement resulting in higher pin density for the package. Higher pin density requires finer pitch of I/O connecting leads. Ball Grid Array packages meet the higher density pin requirements and are being used to replace current Quad Flat Package (QFP) due to the advantages of the BGA over the traditional QFP package.

BGA packages have less coplanarity problems, have self-alignment capability, and have better yield than QFP packages.

There are many kinds of ball attach technologies available, but they are all complicated in the ball attach process, and hard to get uniform balls on the substrate.

One example of ball attach is the use of a dispensing machine to dispense solder paste on the substrate directly. Since the deposited solder paste may vary in volume, each solder ball may have a different metal content. It is hard to control the solder ball height. The productivity of dispensing method is lower, but the major issue is the short ball height.

Another process is the attachment of preformed balls. There are two methods, one for plastic packages, and one for ceramic packages. A Eutectic solder ball is used for plastic BGA packages and a high temp solder ball is used for ceramic BGA packages.

A solder wire bond is used to form BGA balls. A wire bonder is to bond solder wire on the lead pads of substrate. The solder wire is then reflowed to melt solder into balls. This process has low productivity and low solder ball height problems.

A punch metal pellet Ball attachment process is a common method used to form the balls on a BGA package Visual inspection system must be used to ensure 100% ball placement.

Each of the above processes does not ensure uniform ball height or size, nor ensure that a ball is placed at each desired place on the semiconductor package.

SUMMARY OF THE INVENTION

The invention is to a method for forming solder contact balls for a ball grid array semiconductor device. A solder sheet is formed having solder elements extending out at least one side of the solder sheet. The solder sheet is placed over and aligned on a semiconductor package on which solder balls are to be electrically connected to contact areas. The solder sheet is aligned with one solder element over each contact area. The package and solder sheet is heated to cause the solder elements on the solder sheet to separate and reflow such that the surface tension of the reflowed solder of each solder element forms a solder ball over a contact area.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
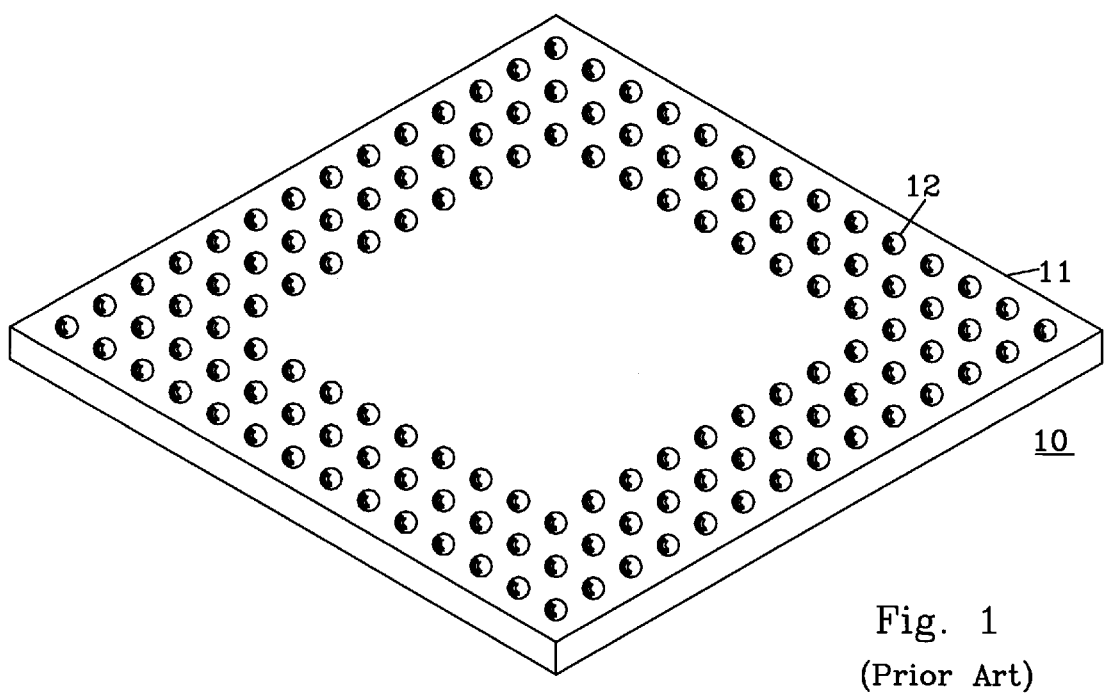
FIG. 1 shows a semiconductor device with ball grid array contacts.

FIG. 1 shows a semiconductor device 10 which includes the substrate 11 and an array of solder ball contacts 12. Each solder ball is attached to a contact point (see FIG. 6) under the solder ball. The contact point may be either a via that extends into the substrate 11 to contact an element on the semiconductor chip, or may be a conductor on the substrate that interconnects with other circuitry or a contact pad on the semiconductor device.

Figure 2:
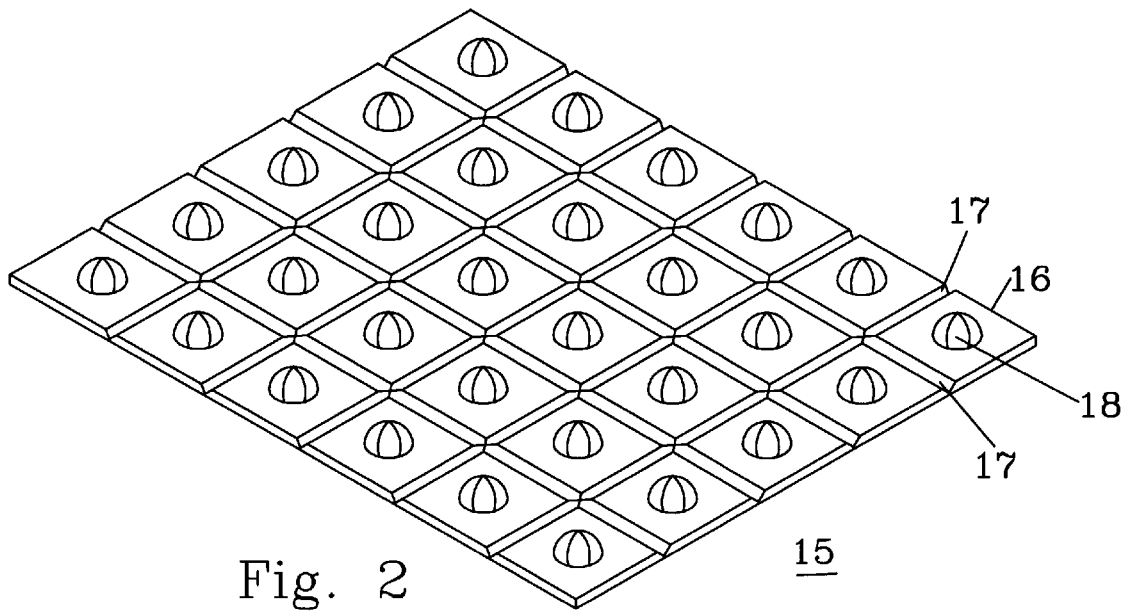
FIG. 2 shows a solder plate with balls formed on segregate smaller plates.
Figure 2A:
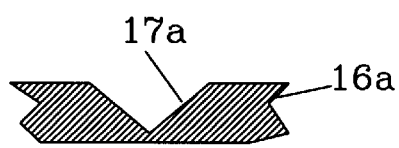
FIG. 2A shows a first embodiment of a channel.
Figure 2B:
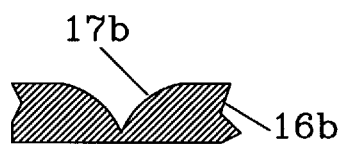
FIG. 2B shows a second embodiment of a channel.

FIG. 2 shows a solder plate 15 used in forming solder ball contacts used in ball grid array semiconductor devices. Solder plate 15 is formed with a plurality of segments 16 separated by channels 17. Each of the segments 16 has a hemispherical half-ball formed on the surface of the segment 16. Plate 15 can be formed by molding, stamping or other forming processes.

Figure 3:
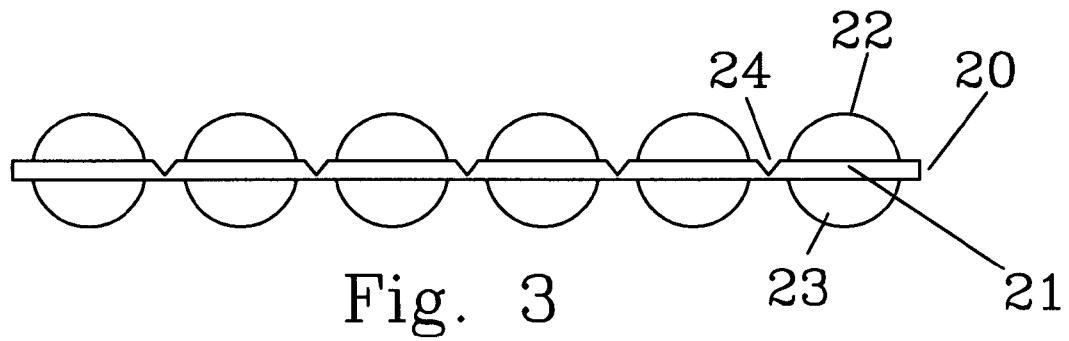
FIG. 3 shows a solder plate with hemispherical half-balls formed on both sides of the solder plate.

FIG. 3 is a side view of a solder plate 20 which has channels 24 separating each square segment 21. Each segment 21 has a half-ball elements 22 and 23 on opposites sides of a segment 21.

Figure 4:
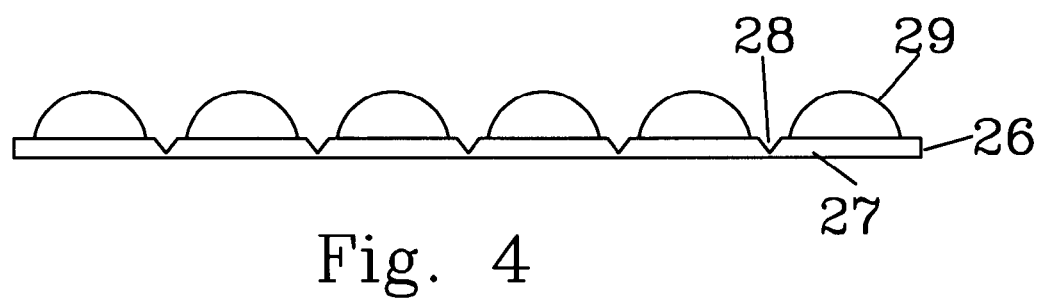
FIG. 4 shows a solder plate with hemispherical half-balls formed on only one side of the solder plate.
Figure 5:
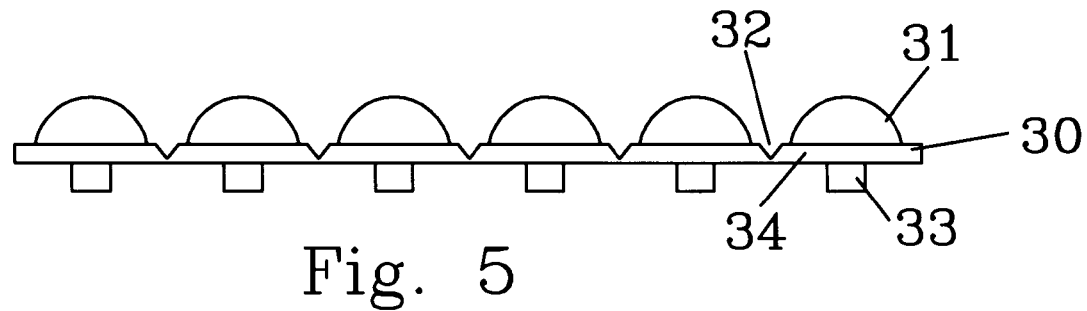
FIG. 5 shows a solder plate with hemispherical half-balls formed on one side of the solder plate and a geometric shape on the other side of the solder plate.

FIG. 4 is a side view of a solder plate 26 which is segmented into squares 27 by channels 28. A half-ball element is formed on one side of each square 27, FIG. 5 is a side view of a solder plate 30 which has been segmented into squares by channels 32. A half-ball element 31 is formed on one side of solder sheet 30 and a generally rectangular elements 33 is formed on the other side of sheet 30.

Figure 6:
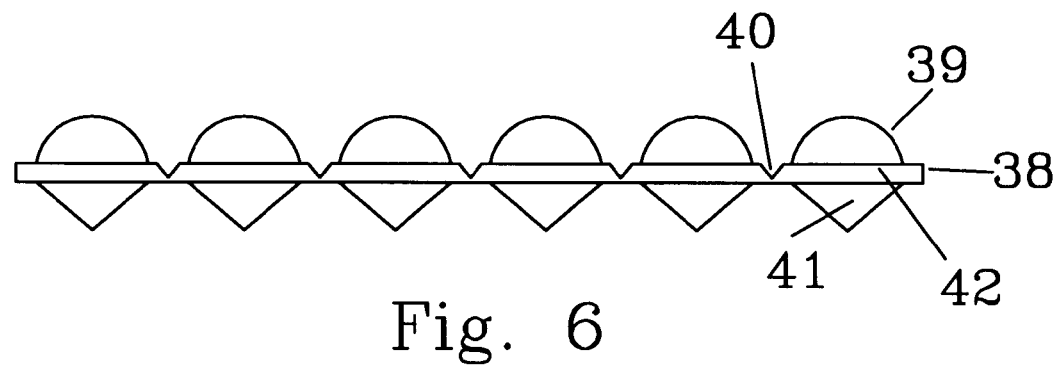
FIG. 6 shows a solder plate with hemispherical half-balls formed on one side of the solder plate and a conical shape formed on the other side of the plate.

FIG. 6 is a side view of a solder plate 38 which has been segmented into squares by channels 40. A half-ball element 39 has been formed on one side of solder plate 38 and a conical element 41 has been formed on the other side of solder sheet 38.

The solder plates and formed elements of FIGS. 3–6 are give as examples of various examples of solder plates and elements formed thereon. Each of the segments (21,27,34 and 42) of each solder sheet is connected to other segments by a thin channel formed in the solder sheet. The connecting channels should be as thin as possible yet hold the segments together so as to aid in the separation of the segments from each other during a solder reflow process as set forth below.

Figure 7:
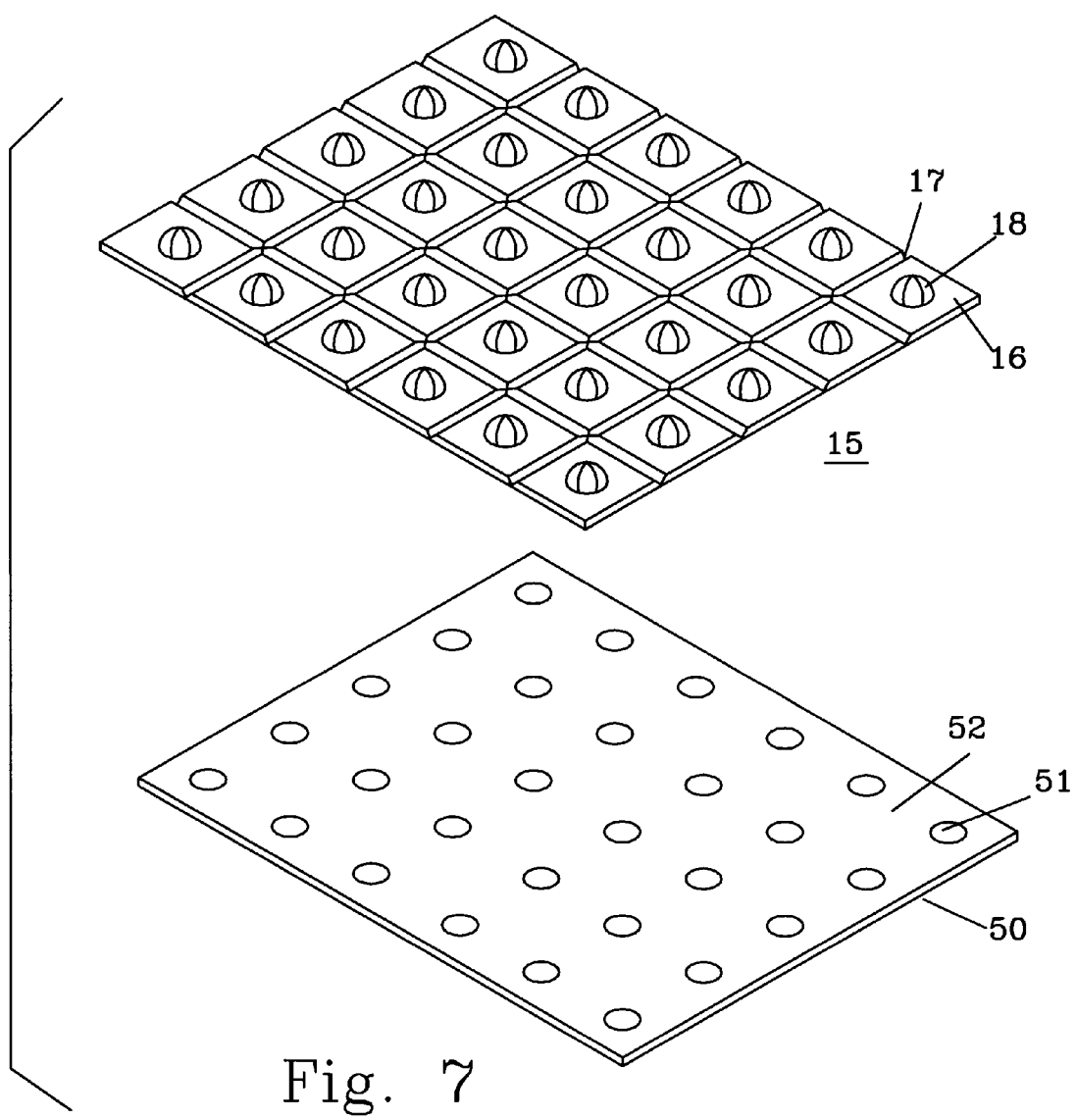
FIG. 7 shows a segmented solder plate positioned over a semiconductor substrate.

FIG. 7 shows a solder sheet 15 with segments 16 and half-balls 18 positioned over a semiconductor package 50. Package 50 has a plurality of contact areas or vias 51 which provide interconnection to the semiconductor device in the package. Sheet 15 is positioned on package 50 and aligned so that one segment 16 is positioned over a contact area 51. If the solder sheet 15 has solder elements on the bottom side such as elements 23, 33 or 41 (FIGS. 3–6), that element will be in contact with the contact areas 51. The contacts areas 51 are solder wetable and the areas 52 around each contact area 51 are not solder wetable.

Figure 8:
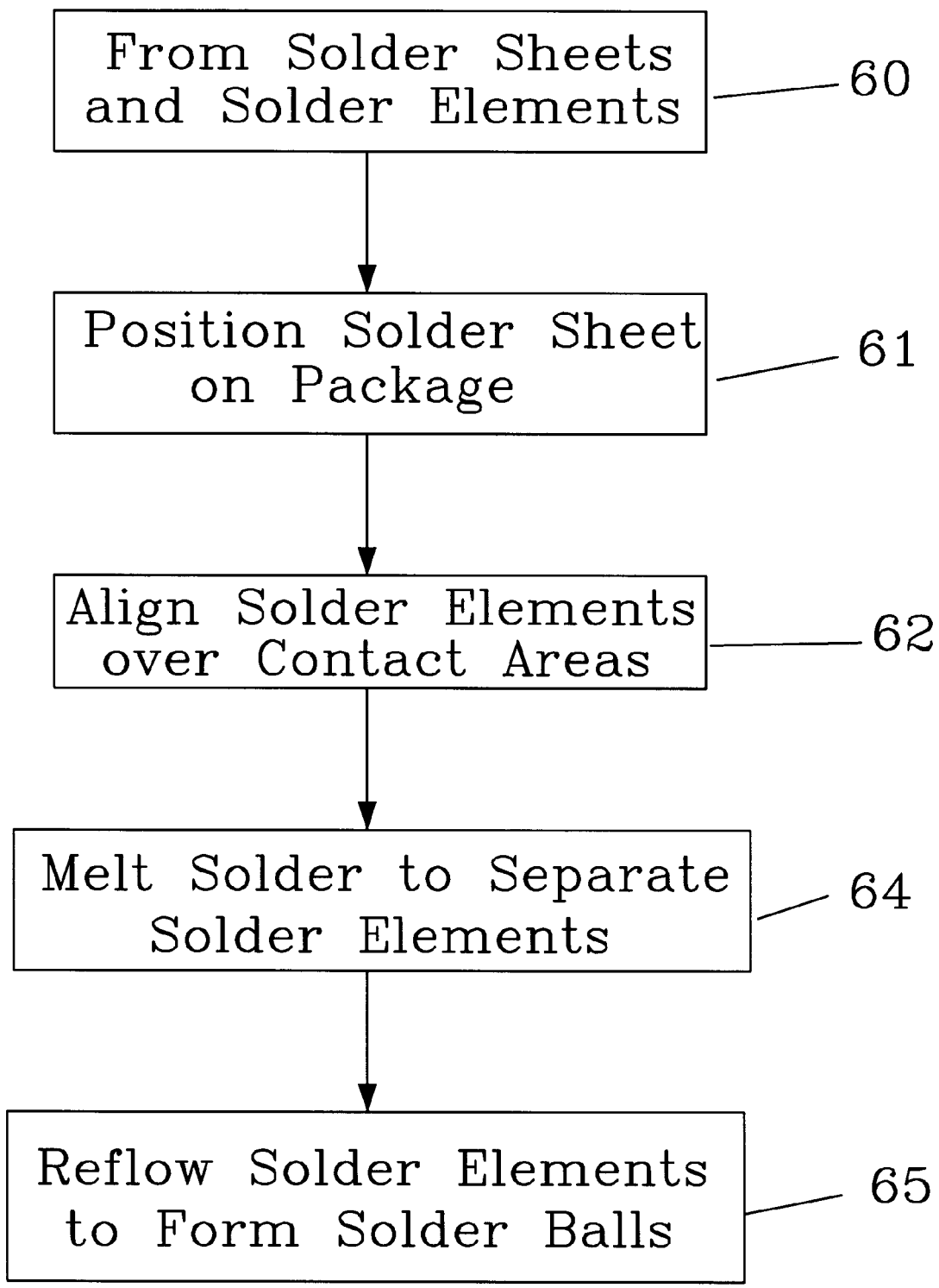
FIG. 8 is a process flow diagram.

FIG. 8 is process flow diagram for forming the solder ball contacts by solder reflow. A segmented solder sheet is formed with solder elements on at least one side of the solder (60). The solder sheet 15 is placed on the semiconductor package 50 on which the solder ball contacts are to be formed (61). The solder sheet 15 is aligned on the semiconductor substrate (62) such that one segment 16 and a solder element 18 is over a contact area 51 on the package 50. Thereafter, the package 50 and aligned segments 16 are heated (64)to cause the solder to reflow, separating the segments 16 and to form solder balls (65) utilizing the surface tension of the solder to form a ball from a segment 16 and the solder element 18 thereon.

A ball will adhere to a contact area 51 which is solder wetable, but there will be no solder on the areas 52 surrounding the contact areas 51. optionally, a solder flux may be applied to each contact area 51 prior to aligning a segment 16 and solder element 18 over the contact area 51.

What is claimed:

1. A method for forming solder contact balls for a ball grid array semiconductor device, comprising the steps of:

forming a continuous solder sheet having solder elements extending out at least one side of the continuous solder sheet;

placing the continuous solder sheet over a semiconductor package on which solder balls are to be electrically connected to contact areas;

aligning the continuous solder sheet with one solder element over each contact area; and heating the package and the continuous solder sheet to cause the solder elements on the continuous solder sheet to separate and reflow such that the surface tension of the reflowed solder of each solder element forms a solder ball over a contact area.

2. The method according to claim 1, wherein the solder elements extend out another side of the continuous solder sheet.

3. The method according to claim 1, wherein the continuous solder sheet is segmented with channels such that each segment includes a solder element.

4. The method according to claim 1, wherein the volume of each solder ball is controlled by controlling the size of each solder element.

5. The method according to claim 1, including the step of applying a solder flux to the contact area prior to aligning the solder elements over the contact areas.

6. The method according to claim 3, wherein the solder sheet segments are all the same size and are segmented such that each segment includes a solder element.

7. A method for forming solder contact balls for a ball grid array semiconductor device, comprising the steps of:

forming a continuous solder sheet having solder elements and segments, one for each segment, extending out at least one side of the solder sheet;

placing the continuous solder sheet over a semiconductor package on which solder balls are to be electrically connected to contact areas;

aligning the continuous solder sheet with one solder element over each contact area; and heating the package and the continuous solder sheet to cause the solder elements on the continuous solder sheet to separate and reflow such that the surface tension of the reflowed solder of each solder element forms a solder ball over a contact area.

8. The method according to claim 7, wherein the solder elements extend out another side of the continuous solder sheet.

9. The method according to claim 7, wherein the solder sheet is segmented with channels such that each segment includes a solder element.

10. The method according to claim 7, wherein the volume of each solder ball is controlled by controlling the size of each solder element.

11. The method according to claim 7, including the step of applying a solder flux to the contact area prior to aligning the solder elements over the contact areas.

12. The method according to claim 1, wherein the continuous solder sheet segments are all the same size and are segmented such that each segment includes a centrally located solder element.

* * * * *